United States Patent
Terrill et al.

(10) Patent No.: US 6,642,064 B1
(45) Date of Patent: Nov. 4, 2003

(54) METHOD OF MAKING A HIGH DENSITY PROGRAMMABLE LOGIC DEVICE IN A MULTICHIP MODULE PACKAGE

(75) Inventors: Richard S. Terrill, Sunnyvale, CA (US); Donald F. Faria, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 08/810,567

(22) Filed: Mar. 3, 1997

Related U.S. Application Data

(62) Division of application No. 08/393,576, filed on Feb. 23, 1995, now Pat. No. 5,642,262.

(51) Int. Cl.[7] .............................................. G01R 31/26
(52) U.S. Cl. ........................................................ 438/15
(58) Field of Search .......................................... 438/15

(56) References Cited

U.S. PATENT DOCUMENTS

| | | | |
|---|---|---|---|
| 4,630,096 A | 12/1986 | Drye et al. ..................... 357/81 |
| 5,089,936 A | 2/1992 | Kojima et al. ............... 361/387 |
| 5,137,836 A | 8/1992 | Lam ................................ 437/8 |
| 5,376,825 A | 12/1994 | Tukamoto et al. ........... 257/685 |
| 5,378,981 A | 1/1995 | Higgins, III ................. 324/765 |
| 5,396,403 A | 3/1995 | Patel ............................ 361/705 |
| 5,399,505 A | 3/1995 | Dasse et al. .................... 437/8 |
| 5,444,296 A | 8/1995 | Kaul et al. .................... 257/686 |
| 5,444,298 A | 8/1995 | Schutz et al. ................ 257/691 |
| 5,509,203 A | 4/1996 | Yamashita .................... 29/879 |
| 5,523,586 A | * 6/1996 | Sakaurai ........................ 257/48 |
| 5,640,337 A | * 6/1997 | Huang et al. ................ 364/578 |

FOREIGN PATENT DOCUMENTS

| FR | 2 630 859 | 4/1988 |
|---|---|---|
| JP | 58-166755 | 10/1983 |
| JP | 5-235198 | 9/1993 |

OTHER PUBLICATIONS

"Error Detection and Fault Isolation Packaging for Circuit Chips," *IBM Technical Disclosure Bulletin*, vol. 30, No. 9, 2/88.

"CPLD Module Packs 50k Usable Gates, 360 I/O Pins," brochure from Altera Corporation reprinted from *Electronic Design*, Apr. 4, 1994, 4 pp.

* cited by examiner

*Primary Examiner*—Brian Dutton
(74) *Attorney, Agent, or Firm*—Babak S. Sani; Townsend and Townsend and Crew LLP

(57) ABSTRACT

A high performance single package multi-chip module multiplies the logic density of the highest density monolithic programmable logic device (PLD). A dual-sided substrate carries multiple prepackaged PLDs on a top side and a field programmable interconnect (FPIC) die on a bottom side. The prepackaged PLDs and the ability to use the substrate as a burn-in vehicle for the FPIC die results in reliable and reworkable assembly process with minimized yield loss.

3 Claims, 3 Drawing Sheets

METHOD OF MAKING A HIGH DENSITY PROGRAMMABLE LOGIC DEVICE IN A MULTICHIP MODULE PACKAGE

This is a Division of application Ser. No. 08/393,576 filed Feb. 23. 1995.

BACKGROUND OF THE INVENTION

The present invention relates in general to programmable logic devices (PLDs), and in particular to a novel PLD product that realizes high logic density by combining several smaller PLDs on a multi-chip module substrate.

System Designers are increasingly challenged with the dichotomy of increasing functionality and decreasing form-factor. There are strong motivating factors behind this requirement, but few resources to assist engineers to meet the demands. One of the key resources is integration of electronic circuitry into fewer separate components.

At lower logic densities this is often done by integrating multiple small and medium scale logic functions into PLD-type devices. This integration reduces device count, and the enhanced flexibility of programmable logic allows increased system functionality that was previously unavailable in standard logic functions. In systems with more than a few thousand gates, high-density PLDs provide significant part-count reductions. This frequently occurs during a second-phase of a product, during a product shrink or repackaging.

For designs that go into high volume productions (thousands of units) it is often cost effective to develop a semi-or full-custom logic device such as a gate array or application specific integrated circuit (ASIC) to achieve the highest integration and maximum cost reduction. The tradeoff of using custom devices is that once they are manufactured, any modifications incur a second design charge. Corrections for logic errors in the design double the development cost, making it critical that the design is correct and complete prior to manufacturing the custom device.

Designers desire the cost and integration benefits from the custom-solutions, but must manage the risk and cost of design errors. Several strategies have evolved to address this problem, with the two most common being design simulation, where a software model of the design is tested with simulated test vectors in an attempt to find error conditions, and emulation or prototyping, where a hardware model of the design is tested with the same vectors, to attempt to find any design errors. The principle difference between the two validation methods is how quickly they can identify errors in a design.

Simulation is the easiest way to verify a custom-logic design since it can be done in a virtual sense, using a software model of the design. There are, however, pitfalls associated with simulation. The first is that simulation is very slow. A software model of a logic design is inherently slower than the corresponding hardware. Although recent advances in parallel computing hold the promise to enable faster simulation, the speed with which test vectors can be sent into the software model sets an upper limit to the exhaustiveness of testing that is achievable in a fixed time.

Simulation is also limited by the ability of an engineer to generate test vectors and the corresponding responses that "should" be returned to the device. This approach requires that the engineer generate accurate vectors, and is limited by the human-bandwidth available to assemble the test suite. Formal verification, where mathematical proofs are used to test models rather then relying on exhaustive test vectors, will alleviate the burden on the designer, but the inherent slowness of simulation puts an upper limit on its usefulness.

Emulation of a logic design uses a hardware model instead of a software model to validate the test and expect vectors for a design. While emulation still requires the generation of a test suite, the hardware-based emulation model allows a much faster cycle, since the vectors may be applied much faster to the hardware system than to the software model. With emulation hardware being combined with the formal proof validation techniques mentioned earlier, hardware emulation emerges as the ideal method to validate custom designs.

Hardware prototyping systems rely on a set of reconfigurable PLDs in a generic interconnect structure. The design is mapped into the uncommitted logic resources of the PLDs in the system. Two such prototyping products have been developed by Altera Corporation of San Jose, Calif., and are fully described in separate U.S. patent applications with Ser. Nos., 08/206,774, and 08/348,280.

Emulation or prototyping systems, however, tend to be more costly and, while they provide higher density, may not do so very efficiently. Due to the architecture of most PLDs, the efficiency of the design mapping is around 50–70%, depending on the type of PLD. Often the PLDs are used for routing as well as logic, which further reduces their effective density. Thus, to achieve a useful density of 100,000 gates, it may be necessary to provide 250,000 available gates. This would require twenty-five 10,000 gate devices which would typically be mounted on a printed circuit board with support hardware and cooling equipment. The application of such hardware prototyping systems is therefore limited to those designs that can justify the costs associated with such prototyping systems.

There is therefore always a need for more cost-effective programmable logic products that provide higher densities of usable logic.

SUMMARY OF THE INVENTION

The present invention provides, in a single cost-effective, high performance package, an apparatus for multiplying the gate count of the highest density programmable logic device available in monolithic silicon.

Broadly, the present invention provides a programmable logic apparatus in a single package which includes: a multilayer substrate having a top side and a bottom side, with the bottom side having a plurality of external connectors; a plurality of prepackaged monolithic PLDs mounted on the top side of the multilayer substrate; and a field programmable interconnect (FPIC) die attached on the bottom side of the multilayer substrate, wherein the FPIC die on the bottom side of the multilayer substrate is protected by a ceramic lid. The multilayer substrate further includes conductive nets and vias through which the plurality of PLDs are electrically coupled to the FPIC and the external connectors. Therefore, by providing programmable interconnection between a plurality of PLD packages, the apparatus of the present invention offers a single programmable logic package with logic capabilities several factors higher than that available by the highest monolithic PLDs. Also, the two-level packaging process of the present invention eliminates several manufacturing problems associated with conventional multichip module designs.

A better understanding of the nature and advantages of the programmable logic apparatus of the present invention may be had with reference to the detailed description and the drawings below.

DESCRIPTION OF SPECIFIC EMBODIMENTS

Figure 1:
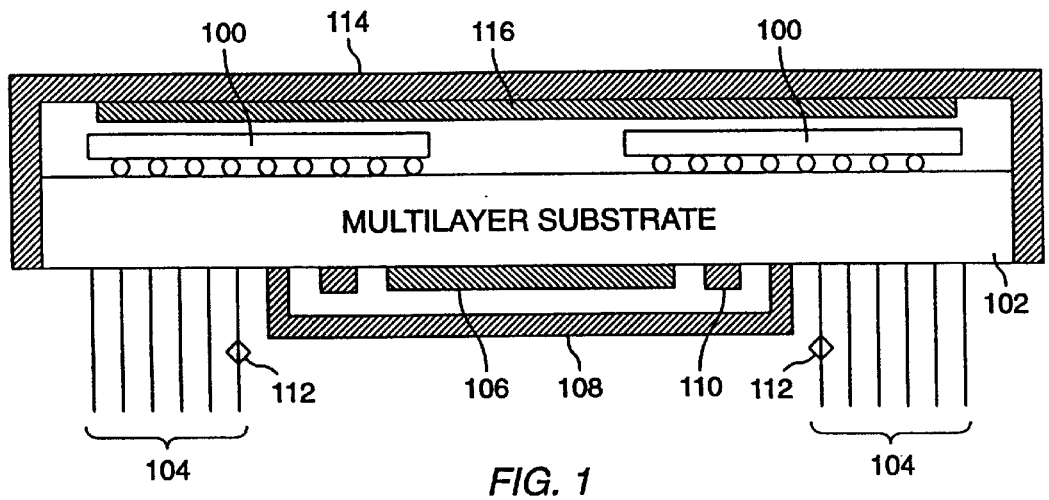
FIG. 1 shows a side view of an embodiment of the programmable logic apparatus according to the present invention.

Referring to FIG. 1, there is shown a side view of an embodiment of the programmable logic apparatus of the present invention. Multiple prepackaged programmable logic devices 100 are mounted on a top side of a multilayer substrate 102. The PLD packages 100 are covered by a protective lid 114. External connectors or pins 104 extend from the bottom side of the multilayer substrate 102, in the center of which a field programmable interconnect (FPIC) die 106 is attached. A lid 108 protects the FPIC die 106 as well as other electronic components 110 such as power supply decoupling capacitors and clamp diodes.

The use of prepackaged PLDs 100 as opposed to the conventional bare-die multichip module approach, increases manufacturing yield and reduces overall costs as will be described hereinafter. A dual-sided substrate 102 offers a number of advantages including smaller overall size for the apparatus, as well as efficient routing of I/O signals between the pins 104 and the FPIC 106. Using a high density PLD product such as Altera's 12,500 gate EPF81188, the apparatus of the present invention offers a 50,000 gate programmable logic device.

Mechanical Design

Figure 2:
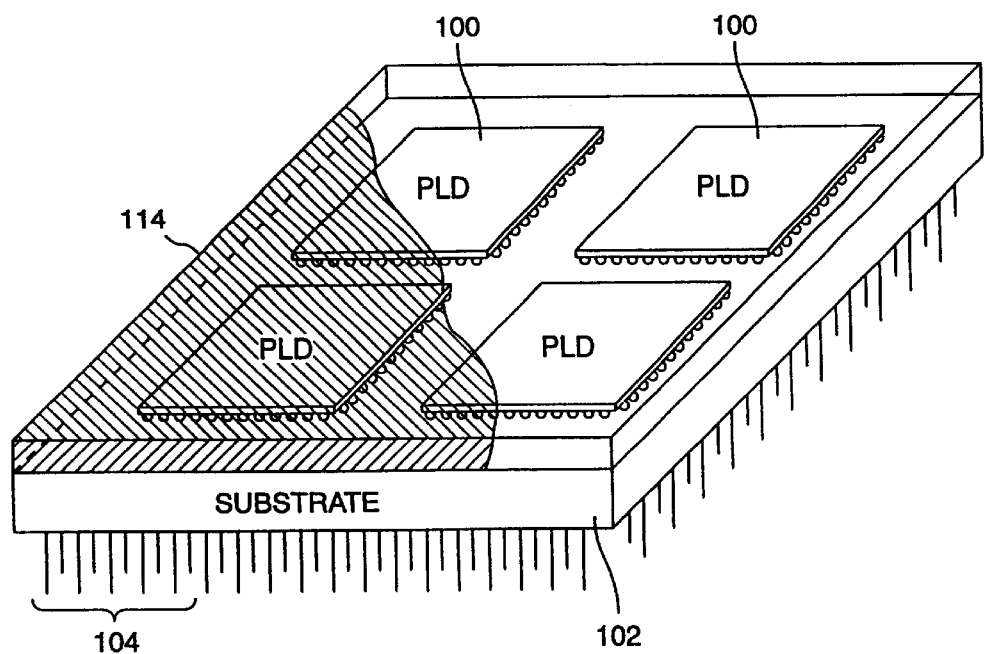
FIG. 2 shows a top view of an exemplary programmable logic apparatus according to the present invention.

An exemplary embodiment of the top side of the apparatus of the present invention is shown in FIG. 2. In this example, the. top side of the apparatus is shown as carrying four high density PLDs 100. The four PLDs 100 are preferably housed in ceramic ball grid array (BGA) packages that are solder-mounted on the top plate of the multilayer substrate 102. The protective lid 114 is preferably made of anodized aluminum and covers the sides as well as the top side of the substrate 102. Under the lid 114, a heat-conductive spacer material 116 is preferably deposited on top of, and in contact with, the four PLDs 100. The spacer material 116 directs heat away from the PLD packages 100.

The exemplary embodiment shown in FIG. 2 preferably uses a cofired ceramic substrate 102. However, other technologies such as thin-film lamination or thin-film deposition may also be used for the multilayer substrate 102. The interconnections through the various layers of the substrate 102 are made using thick-film refractory metals and vertical vias. While other types of conductive layers can be used, the use of thick-film metals trades off reduced capacitance for increased resistance, to minimize noise in the system. To obtain high density pin-packaging, the interstitial spacing between the pins 104 are made as small as, for example, 50 mils. The exemplary embodiment of FIG. 2 could fit the entire system on a substrate 102 having approximately 2.25 inch on each side. Thus, with an interstitial pin spacing of 50 mils, the device provides as many as 560 pins 104. The pins 104 are made longer than usual to provide vertical clearance required by the bottom-side lid 108. The pins 104 are made, for example, 300 mils long with standoffs 112 (FIG. 1) located at the midpoint. This provides sufficient lead-length to assure good electrical connectivity to the target socket, and clearance for the bottom-side components so that the apparatus is not resting on the lid 108.

Figure 3:
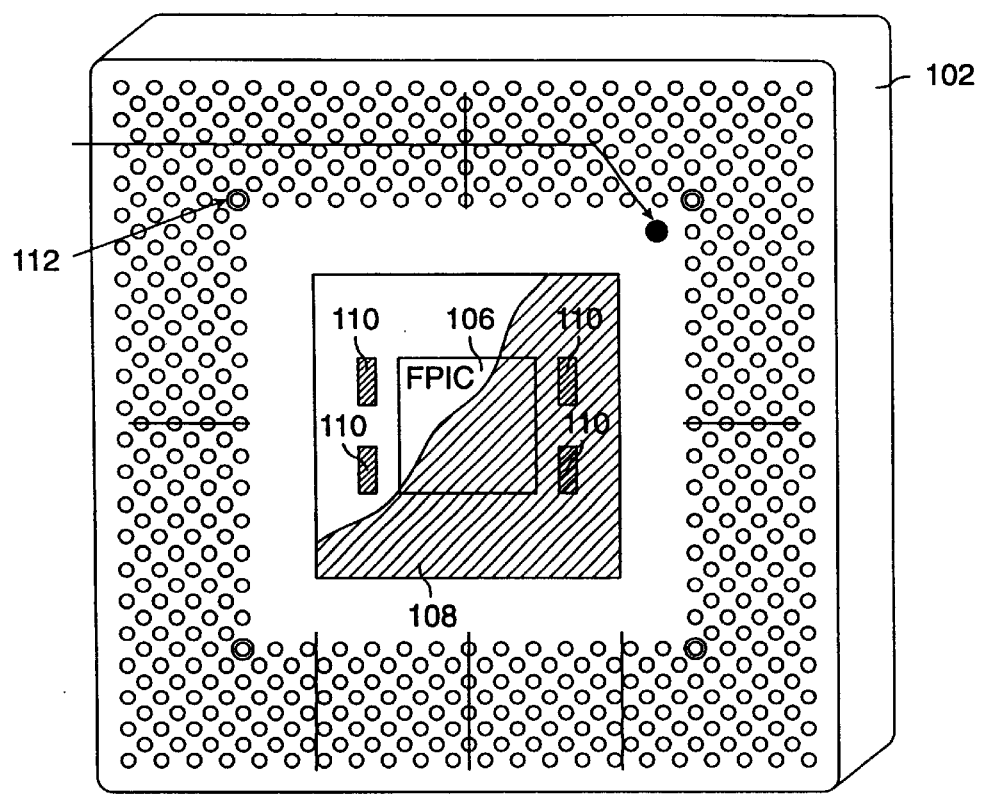
FIG. 3 shows a bottom view of the programmable logic apparatus of the present invention.

FIG. 3 shows the bottom side of the substrate 102 with the FPIC 106 in bare-die form attached in the center. The attachment preferably uses controlled collapse chip connection (C4) solder bumps. The C4 mounting process can be easily reworked without damaging the substrate 102. This simplifies the manufacturing process by allowing the substrate 102 to act as a burn-in vehicle for the FPIC die 106. An example of an FPIC for use in the apparatus of this invention is the FPIC AX1024R manufactured by Aptix Corporation. The bottom side of the multilayer substrate 102 where the FPIC die is attached is preferably covered with a conformal coat which reduces the sheer-stress between the FPIC die 106 and the substrate 102 caused by the different coefficients of thermal expansion of silicon and ceramic. The bottom-side of the substrate also houses other electronic components 110 such as decoupling capacitors and a zener clamp-diode if one is needed. This reduces the number of passive components that the user must place on the target system to support the programmable logic apparatus. All of the components 106 and 110 on the bottom side are covered by a lid 108, preferably made of ceramic.

As logic devices grow in size and the amount of simultaneously switching elements increases, more aggressive noise reduction techniques must be employed. Large decoupling capacitors 110 allow the design engineer to manage switching noise in high-performance systems. The apparatus of the present invention also provides multiple layers in the substrate 102 dedicated to various power supply sources. There are, for example, six logical and ten physical power-planes in the substrate 102 with two layers dedicated to quiet power and ground, two layers dedicated to noisy power and ground for the PLDs which experience more switching, and two more layers dedicated to power and ground for the FPIC. This separation allows the designer to take advantage of multiple power-planes on the target system for noise shielding.

Device Architecture

Figure 4:
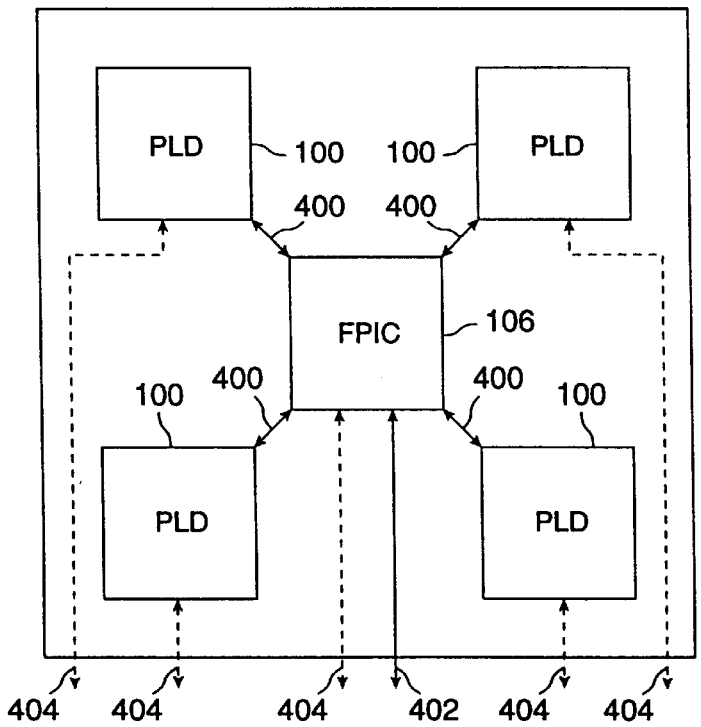
FIG. 4 shows a device architecture for the exemplary embodiment of the present invention as shown in FIG. 2.

FIG. 4 illustrates the architecture for the exemplary programmable logic apparatus of the present invention. The exemplary apparatus shown in FIG. 4 combines four PLDs 100 and an FPIC 106 to create a fully symmetric programmable logic device array that may be viewed as a single super high density PLD by the outside world. All logic signals within the device are routed through the FPIC 106, providing symmetric logic delays. All device I/O pins are routed via the FPIC 106, providing transparent decoupling of the internal logic from external pin assignments.

Referring to FIG. 4, with Altera's EPF81188 as PLDs 100, there are 160 I/O channels 400 between each PLD 100 and the FPIC 106, and 360 I/O channels 402 between the FPIC 106 and the external pins 104. The ratio of 360 I/O pins for 50,000 gates ensures that designs will be able to utilize the available logic resources without running out of I/O pins. The EPF81188 as well as the Aptix FPIC device use static random access memory (SRAM) to store configuration data. Thus, all five components in this embodiment require configuration upon power-up. Each one of the five components is provided with a dedicated group of the external pins 104 to route configuration and test channels 404. In this example, there are a total of 52 pins separately routed to allow for independent testing and configuration of each component. Given a 560-pin substrate, there would be 150 remaining pins which are used for power supply connections.

There are therefore a total of 1052 signal channels that are routed through the substrate 102. The substrate 102 includes 20 signal layers in order to accommodate the large number of signal nets. Aptix's FPIC device uses a small-pitch bump-mounting pattern, requiring one routing layer for each "concentric ring" of bond pads. These spider-web of routing fingers are then connected to the other signal layers inside the substrate 102 using vertical vias.

An important consideration from a performance point of view is signal skew (i.e., uneven delays) caused by the signal net routing layout. The routing layout in the programmable logic apparatus of the present invention is designed to minimize the standard deviation of signal net lengths and to maximize symmetry in signal propagation. The device architecture illustrated in the exemplary embodiment of FIG. 4 has a natural symmetrical topology where each PLD 100 is placed directly over one quadrant of the FPIC 106. While the tendency would be to route each PLD 100 to its corresponding quadrant of the FPIC 106 to avoid crossing routing channels between devices, this would make the programmable logic apparatus less routable from the user's perspective. Such routing would also increase the probability of uneven and longer signal nets. This is so because the FPIC 106 works most efficiently when connecting nearest-neighbor pads. The FPIC 106 includes an array of, for example, 32×32 pads any one of which can be connected to another through programmable pass transistors. The closer two pads are the less routing resources are used to connect them. It follows then that it is preferable to have as many short connections as possible. If each PLD 100 were routed to its corresponding quadrant on the FPIC 106, each quadrant of the FPIC 106 would have near-neighbors from the same PLD 100. This, of course, would be practically useless since there is never a reason for a PLD 100 to communicate with itself via the FPIC 106.

To address the routing problem, the present invention provides for a scrambled routing pattern such that each of the four PLDs 100 connects to each of the four quadrants of the FPIC 106. The I/O channels 400 for each of the PLDs 100 are divided into four groups, and the four groups are routed to the four quadrants of the FPIC 106, respectively. Thus, each of the four quadrants in the FPIC 106 has representative I/O channels 400 from each of the four PLDs 100. This maximizes the routability of the apparatus by maximizing the probability of finding near-neighbors. While this scrambling technique adds to the required number of layers in the substrate 102, it significantly increases efficiency and utility of the programmable logic apparatus.

Manufacturing Process Flow

Figure 5:
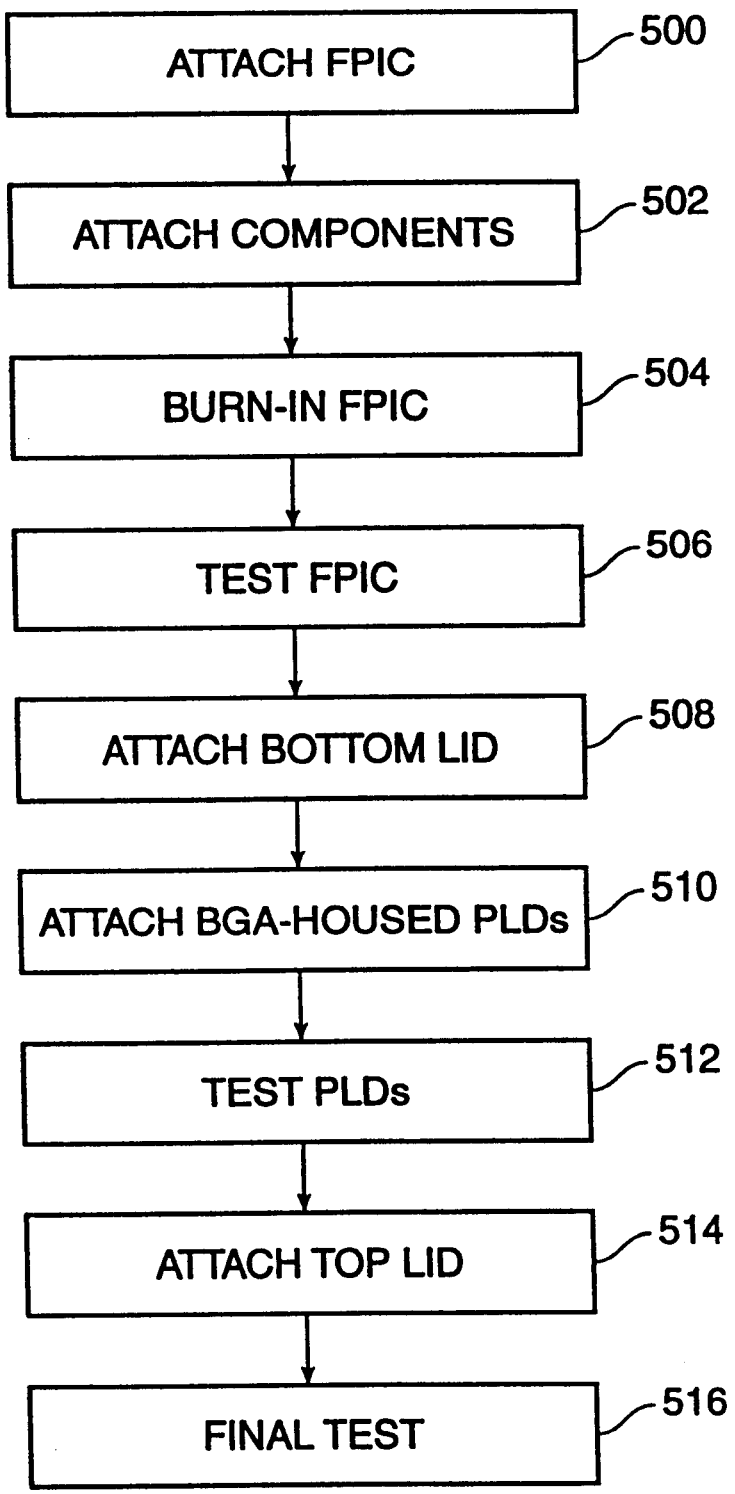
FIG. 5 illustrates an assembly flow for manufacturing the programmable logic apparatus of the present invention.

The programmable logic apparatus of the present invention has been designed with an assembly flow that maximizes reliability and reworkability and minimizes yield-loss and manufacturing costs. FIG. 5 is a flow diagram showing the sequence of steps in the assembly process of the present invention. The first step 500 is to attach the FPIC 106 to the center of the bottom side of the substrate 102. The attachment process uses the controlled-collapse chip connection (C4) solder-bump technology which can be performed at a temperature of, for example, approximately 500° C. Next, at step 502, the components 110 (e.g., decoupling capacitors) are solder-mounted at a lower temperature of, for example, 450° C.

Because the FPIC has over 1000 pins, it is impossible to fully test the FPIC during wafer sort, and burn-in of the die is a challenge because there are very few C4 burn-in processes available. The present invention solves the FPIC testing problem by using the substrate 102 as a burn-in vehicle for the FPIC. This is possible because in the case of a bad FPIC die, the C4 attach process can be easily reworked without damaging the substrate. Thus, after the FPIC die and the decoupling capacitors are mounted on the bottom side of the substrate, the apparatus is put through a burn-in process at step 504. This burn-in step takes place at a low temperature of, for example, 150° C.

After the burn-in step 504, the FPIC is tested at step 506, and removed and replaced if necessary. The main challenge during the test step 506 is probing all the bumps on the FPIC die. Once the FPIC is attached to the substrate, all of the bumps may be contacted via the I/O pins 104 and the top-side mounting pattern for the BGA packaged PLDs. The bottom side ceramic lid is attached next at step 508. Thereafter, the BGA-housed PLDs are solder-mounted onto the top side of the substrate at step 510 at approximately 400° C. At step 512, the PLDs are tested, removed and replaced if necessary. Next the topside lid 114 and spacer material 116 are attached at step 514, after which the apparatus undergoes final test at step 516.

The assembly process flows in a descending process-temperature order, allowing rework of subsequent process steps without damaging work done during earlier processing. An important advantage of the process and apparatus of the present invention over the conventional multichip module devices, is the elimination of the known good die problem for the PLDS. Removing a wire-bonded die with more than 200 wires makes for a very difficult and potentially costly rework process. With multiple PLDs requiring nearly 1000 wirebonds, conventional bare-dice mounting would be impractical. The present invention uses prepackaged PLDs to address the problem of known-good-die testing. The prepackaged PLDs are fully tested and burned-in prior to mounting on the substrate. In case of a part failure after mounting, removing the BGA packages is a simple task that does not damage the relatively expensive substrate. While prepackaged PLDs cost more than PLD dice, this cost is more than compensated for by an overall reduction in yield-cost of the finished product, as well as a less expensive and readily reworkable assembly process. For the FPIC die, the use of the substrate as a burn-in vehicle provides a known-good-die test capability. Existing known-good-die processes involve a sacrificial or temporary substrate for the die during the burn-in testing. After the test, the die is detached and further handling is required prior to final assembly. There is therefore a risk of damage to the die after the test and prior to final assembly. In the process of the present invention, however, if the FPIC die fails burn-in, it is removed and the substrate salvaged. If the FPIC die passes, no further FPIC assembly steps are required removing the risk of further damage to the die after it has passed burn-in.

In conclusion, the present invention provides in a single cost-effective, high performance package, an apparatus for multiplying the gate count of the highest density programmable logic device available in monolithic silicon. While the above is a complete description of the preferred embodiment of the present invention, it is possible to use various alternatives, modifications and equivalents. For example, the apparatus may be designed with more than four PLDs on the top side of the substrate. Also, instead of the ceramic technology, the substrate may use other technologies such as laminate or silicon. An attractive option would be to use a silicon substrate with etched wells for the active components and laminate interconnect. Therefore, the scope of the present invention should be determined not with reference to the above description but should, instead, be determined with reference to the appended claims, along with their full scope of equivalents.

What is claimed is:

1. A method for assembling a programmable logic apparatus comprising the steps of:
   (a) attaching a field programmable interconnect (FPIC) die to a bottom side of a substrate;
   (b) performing a burn-in test on the FPIC die as attached on the substrate;
   (c) mounting a plurality of prepackaged programmable logic devices (PLDs) on a top side of the substrate; and
   (d) testing the prepackaged PLDs.

2. The method of claim 1 further comprising the steps of:
   (e) attaching a bottom lid after the step of performing a burn-in test to cover the FPIC die;
   (f) attaching a top lid after the step of testing the prepackaged PLDs; and
   (g) performing a final product test.

3. The method of claim 1 wherein said step of attaching an FPIC die uses a controlled collapse chip connection technology.

* * * * *